United States Patent [19]
Mostyn, Jr.

[11] Patent Number: 4,782,520
[45] Date of Patent: Nov. 1, 1988

[54] PULSE RECEIVER CIRCUIT PROVIDING LONGITUDINAL BALANCE

[75] Inventor: William T. Mostyn, Jr., Hewitt, Tex.

[73] Assignee: Telco Systems, Inc., Waco, Tex.

[21] Appl. No.: 551,562

[22] Filed: Nov. 14, 1983
(Under 37 CFR 1.47)

Related U.S. Application Data

[63] Continuation-in-part of Ser. No. 290,731, Aug. 6, 1981, Pat. No. 4,501,932.

[51] Int. Cl.$^4$ .......................... H04B 1/24; H04B 3/36; H04Q 1/34; H04Q 3/04
[52] U.S. Cl. ................................ 379/342; 307/132 E; 375/94; 379/286; 379/287; 379/412
[58] Field of Search ........... 179/16 EA, 16 AA, 16 F, 179/16 A, 16 B, 18 FA, 18 EB, 18 GD, 18 GC; 307/138, 132 E, 132 EA, 254; 375/94, 75, 4, 3; 379/342, 385, 287, 286, 377, 412

[56] References Cited

U.S. PATENT DOCUMENTS

| | | | |
|---|---|---|---|
| 3,458,727 | 7/1969 | Watkins, Jr. | 307/255 |
| 3,594,510 | 7/1971 | Blashfield | 379/286 |
| 3,821,486 | 6/1974 | Mussman | 340/825.06 |
| 3,854,012 | 12/1974 | Chambers, Jr. | 379/231 |
| 3,870,902 | 3/1975 | Takarada | 307/254 X |
| 3,941,937 | 3/1976 | Gauthier | 379/286 |
| 3,985,970 | 10/1976 | Lerault et al. | 379/164 |
| 4,087,646 | 5/1978 | Brolin et al. | 379/380 |
| 4,306,119 | 12/1981 | Kutzavitch | 379/362 |
| 4,322,586 | 3/1982 | Mein et al. | 379/377 |
| 4,375,014 | 2/1983 | Horak | 379/299 |
| 4,429,185 | 1/1984 | Adrian et al. | 379/377 |
| 4,446,338 | 5/1984 | Rosch | 379/385 |
| 4,454,477 | 6/1984 | Joffe | 328/149 |
| 4,555,593 | 11/1985 | O'Dea | 379/304 |
| 4,577,064 | 3/1986 | Huft et al. | 379/324 |

*Primary Examiner*—Thomas W. Brown
*Attorney, Agent, or Firm*—Dennis T. Griggs

[57] ABSTRACT

A pulse receiver for connection in a telephone circuit including two coils connected between a voltage potential and ground further including an external impedance that is alternately connected between the coils. The pulse receiver includes a first impedance connected in series with the first coil and a second impedance equivalent to the first impedance connected in series with the second coil and an input circuit connected across the first impedance for detecting the connection of the external impedance of the telephone circuit. Switching circuitry is provided that is connected to the input circuitry and alters a first output node pair from a normally closed state to an open state and alters a second output pair from a normally open state to a closed state in response to a signal received from the input circuitry indicative of the detection of the external impedance connection.

7 Claims, 1 Drawing Sheet

PULSE RECEIVER CIRCUIT PROVIDING LONGITUDINAL BALANCE

RELATED APPLICATION

This application is a continuation-in-part application of U.S. patent application No. 290,731 filed Aug. 6, 1981, now U.S. Pat. No. 4,501,932.

BACKGROUND OF THE INVENTION

1. Field of the Invention

This invention relates to pulse receiving circuits and in particular to pulse receiving circuits that provide longitudinal impedance balancing.

2. Description of the Prior Art

A relay is an electric switching device comprising one or more contacts which open or close circuits. In some relays the switching action is brought about by an electromagnet which closes or opens contacts by means of a movable armature which it attracts or releases.

The switching action of an electromechanical relay is characterized by several factors including mechanical balance and electrical waveform distortion which occurs in response to the bounce, welding of relay contacts in response to arcing and high current flow, pitting of relay contacts which increases circuit resistance, relatively slow response time, relatively low reliability which gradually diminishes with age, and latching current sensitivity. Moreover, the solenoid of the electromechanical relay introduces a high inductive load within the operating circuit.

The forgoing operating characteristics limit, in some way, the use of the electromechanical relay for various applications.

Telephone exchange equipment is an important application area in which electromechanical relays have played an essential role. When a subscriber dials a number, the circuit to the telephone exchange is interrupted as many times as corresponds to the number dialed. Each digit of the dial controls a selection stage comprising an electromechanical multiple contact stepping switch. The rotary dial pulses are coupled to a stepping relay and a timing relay by means of a single pole, double throw pulsing relay having normally closed and normally open switched contacts. The solenoid of the pulsing relay is energized by the flow of current in the subscriber network.

It will be appreciated that the latching current sensitivity of the pulsing relay will be affected by the condition of the telephone equipment, including the subscriber circuit, the telephone transmission lines and power supply regulation. As the equipment grows older, the latching current sensitivity, together with the usual problems of bounce, contact welding, contact pitting, response time and inductive loading, combine to significantly reduce the operating reliability and effectiveness of the rotary dial telephone system.

Another problem introduced by certain relays is the problem of longitudinal balance. Longitudinal balance is the difference in the AC signal voltage from the tip and ring to the device or system ground measured individually. In a normal telephone circuit arrangement, the dial of the subscriber telephone interrupts a circuit consisting of two inductances connected between a power supply and ground, and longitudinal imbalance is caused by an impedance difference between one coils side of the circuit and the other coil's side of the circuit. Lack of longitudinal balance is evidenced by cross talk, miscellaneous noises, TTY chatter, dial tone and or ringing generator noise on the voice line of the telephone. Therefore, there is a requirement that the subscriber end terminal must meet certain longitudinal balance standards to minimize distortions caused by longitudinal imbalance.

SUMMARY OF THE INVENTION

In accordance with the present invention a pulse receiver for connection in an external circuit including a first inductance and second inductance connected between a voltage potential and a ground including an external impedance that is alternately connected between the first and second inductances is provided, wherein the pulse receiver includes a first impedance connected in series with the first inductance and a second impedance connected in series to the second inductance, wherein the second impedance is equivalent to the first impedance. The pulse receiver further includes input circuitry that is connected to the first impedance for detecting the connection of the external impedance in the circuit. Switching circuitry is also connected to the input circuitry for altering a first output node pair from a normally closed state to an open state and altering a second output node pair from a normally open state to a closed state in response to a signal from the input circuitry that is indicative of the detection of the external impedance connection.

In a preferred embodiment of the invention a dial pulse receiver is provided that includes voltage bias circuitry contained in the switching circuit to maintain the normally closed state of the first node pair and a normally open state of the second node pair when the external impedance is greater than a predetermined value, and to maintain the altered states of the first and second output node pairs when the external impedance is less than a predetermined value. In this preferred embodiment, the input circuitry includes a high voltage clamp to protect the first impedance from a high voltage surge across the first impedance. Also in this preferred embodiment, the input circuitry further includes a signal gain control circuit that limits the amount of signal across the first impedance. This is accomplished by shunting a portion of the voltage received across the first impedance when this voltage exceeds a specified value. This preferred embodiment further includes an alternating current filter in the input circuitry to filter out any alternating current components of a signal across the first impedance.

In this embodiment, the switching circuitry includes additional circuit elements to minimize any pulse distortion received from the input circuit. The switching circuitry further includes circuit elements to provide high voltage transient protection to the output circuitry to protect these circuits from any high voltage transients present while switching inductive loads. The circuit elements in the switching circuit are also temperature compensated.

This preferred embodiment provides the first impedance and second impedance of impedance values that have resistive components that are small relative to the resistance components of the first and second inductances. Furthermore, the resistive components of the first and second inpedances are equivalent. Therefore, when the first and second impedances are connected in the circuit, the presence of the pulse receiver does not cause an impedance imbalance in the external circuit.

BRIEF DESCRIPTION OF THE DRAWINGS

The novel features which characterize the present invention are defined by the appended claims. The foregoing and other objects and advantages of the present invention will hereinafter appear, and for purposes of illustration, but not of limitation, an exemplary embodiment is shown in the drawings.

DESCRIPTION OF THE PREFERRED EMBODIMENT

Figure 1:
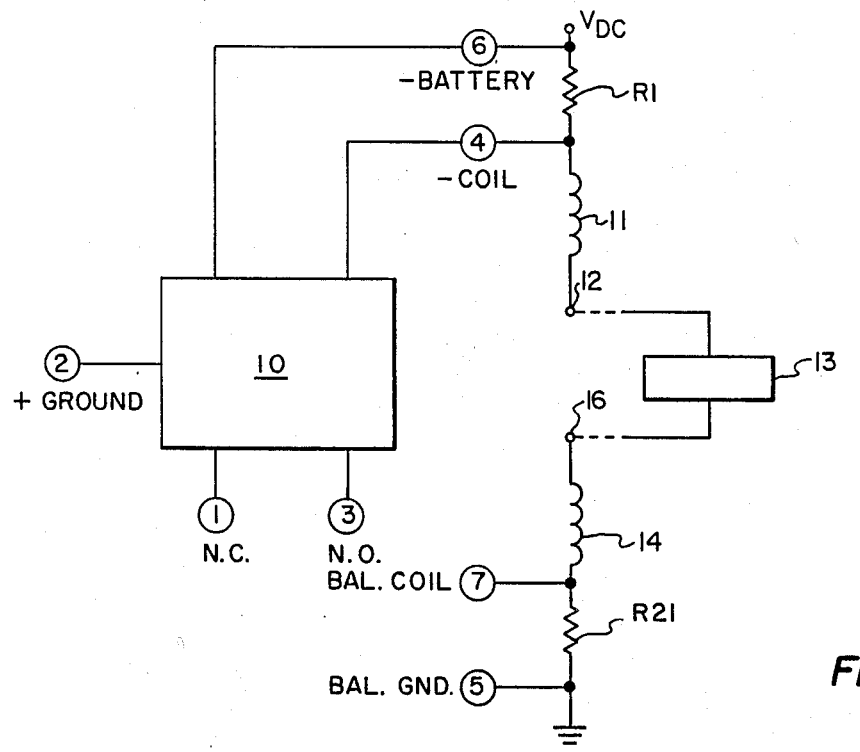
FIG. 1 is a schematic diagram of a portion of a telephone circuit.

This invention relates to a replacement circuit for a relay that activates when an external impedance is connected in a telephone circuit. FIG. 1 is a schematic diagram of a representation of a portion of the telephone circuitry for subscription telephone systems employing rotary dialing devices. The circuit consists of a DC voltage with two inductors 11 and 14 connected on either side of an external impedance 13 that is intermittently connected to terminals 12 and 16. The intermittent connections of the external impedance 13 are the result of the pulses produced by the rotary dial of the telephone. The intermittent connection of an external impedance is detected by sensing a voltage drop across one of the resistors R1 or R21 in the circuit of FIG. 1.

Figure 2:
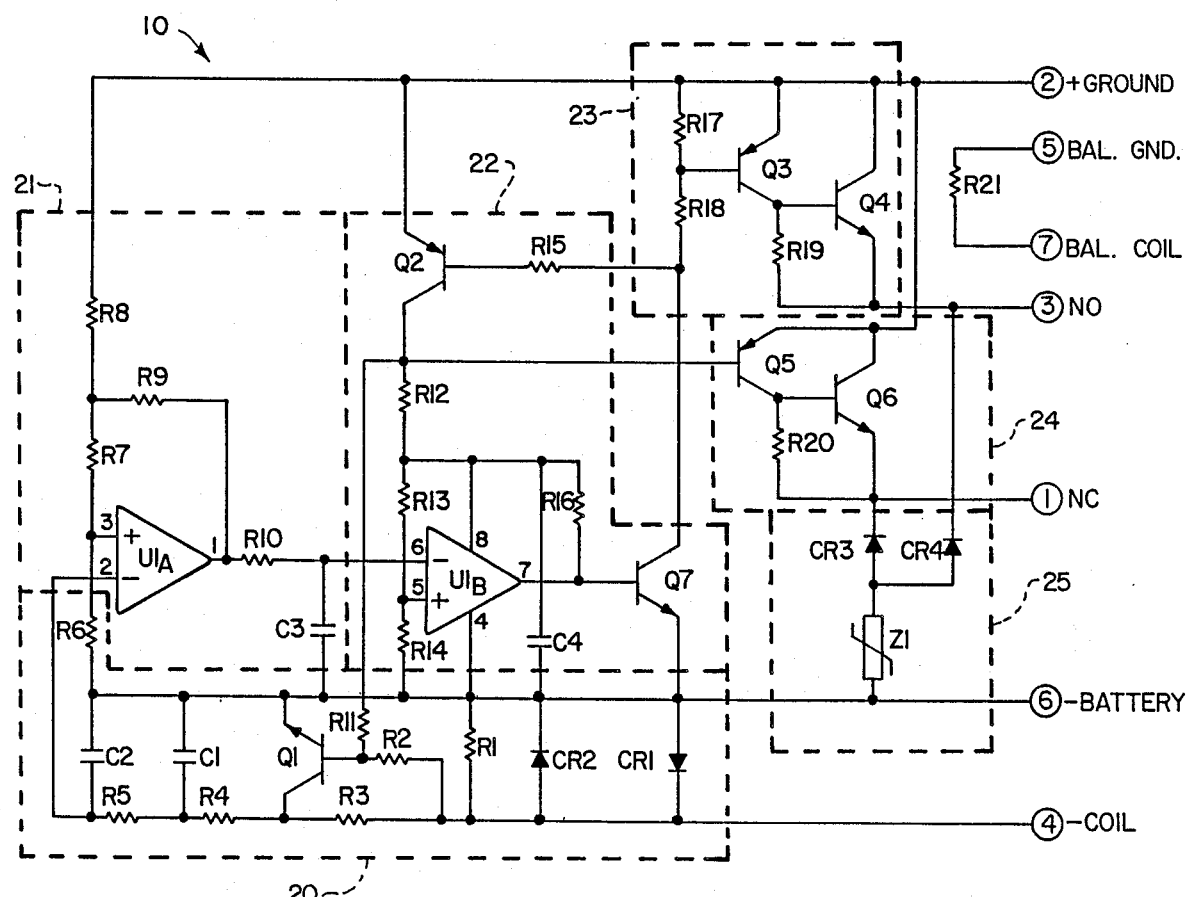
FIG. 2 is a schematic diagram of a pulse receiver circuit.

FIG. 2 illustrates the schematic diagram of a pulse receiver 10. The resistors R1 and R21 of FIG. 1 are shown connected within pulse receiver 10 in FIGURE 2. R21 is a balancing resistor that will be discussed later. R1 is the sensing resistor of the circuit. When the external impedance 13 of FIG. 1 is connected the circuit of FIG. 1 is complete and a current flows through R1 of the pulse receiver in FIG. 2. In FIG. 2, the section of the pulse receiver marked as 20 represents the input circuitry; the section marked 21 represents the first stage of the switching circuitry; and the section marked 22 represents the second stage of the switching circuitry. The output of the switching circuitry or circuits 23 and 24 represent a normally opened relay and a normally closed relay respectively. Section 25 is the transient suppressor circuitry for the output circuits 23 and 24.

The purpose of the input circuitry 20 is to detect the voltage across resistor 1. Diodes CR1 and CR2 are located to limit the voltage placed across R1. In the preferred embodiment the voltage across R1 is in the range of 60 to 70 millivolts. In addition to CR1 and CR2, a signal gain control circuit is provided consisting of transistor Q1 and resistors R11, R2, and R3. Transistor Q1 is prebiased by R11 and R2 and when the voltage across R1 exceeds about 60 to 70 millivolts, transistor Q1 will begin to limit the signal at the junction between R3 and R4. In the preferred embodiment, the transistor selected for transistor Q1 does not have a good saturation characteristic. This signal gain control circuitry protects the pulse receiver from a "shortline condition" or a condition where a low external impedance results in a large voltage drop across R1 (i.e., in the range of 60–300 millivolts) which would, in turn, excessively charge capacitors C1 and C2. Since the pulse receiver is designed to receive pulses at the rate of approximately 12 pulses per second, a large amount of charge placed across capacitors C1 and C2 would not allow these capacitors C1 and C2 to discharge in time to receive the next consecutive pulse. The transistor Q1 signal gain control circuit prevents this condition from occurring.

Capacitors C1 and C2 together with resistors R4 and R5 make up a two stage alternating current filter to filter out any alternating current components of the signal obtained from the input terminals 4 and 6. The output of this input circuitry 20 is connected to the comparator U1A of the first stage 21 of the switching circuitry. The second terminal of U1A is tied to resistor pair R6 and R7 which in turn is tied through R8 to a ground. Resistors R6 and R7 provide a voltage potential at the second terminal of U1A of approximately 60 to 70 millivolts. The first stage 21 of the switching circuit also includes a feedback resistor R9 such that when a low level voltage is applied to the input pin 3 of comparator U1A, the resistor R9 pulls down the junction between resistors R8 and R7 to lower the voltage at pin 3 resulting in a positive feedback. This positive feedback provides the voltage bias that acts to maintain the present state of the switching circuit. The output of U1A is also connected to resistor R10 and capacitor C3 which minimize any pulse distortion received from the input circuitry 21.

The second stage 22 of the switching circuitry includes a second comparator U1B that receives the output from U1A by way of the filter R10, C3. U1B provides additional noise immunity to the switching circuitry. U1B measures the difference between the saturation voltage of the output transistor of U1A and the voltage developed by resistor pair R13 and R14. In addition, R16 provides positive feedback for U1B in a manner similar to the feedback of R9 in the first stage 21. R16 further provides a bias to transistor Q7. In the preferred embodiment the comparators U1A and U1B are low power low offset voltage comparators contained in the National Semiconductor LM393 device. The device description is herein incorporated by reference.

The output of the comparator U1B drives transistor Q7 which in turn drives the two output circuits 23 and 24. When transistor Q7 turns on, transistor Q2 turns on which turns off transistor Q5, turning off transistor Q6 and causing the normally closed output across terminals 1 and 2 to become an open circuit. Likewise, when Q7 turns on, transistors Q3 and Q4 turn on, causing the normally open terminals 2 and 3 to become a closed circuit. In this manner, the two output circuits 23 and 24 act as two relays changing state as a result of the input circuitry 20 detecting the connection of the external impedance.

Any high voltage switching transients which may appear across the terminals 6 and 3 or terminals 6 and 1 are suppressed by a varistor Z1 which is connected to the supply voltage node 6 and isolating diodes CR3 and CR4. The varistor Z1 provides a symetrical, sharp breakdown characteristic which suppresses the transients. When exposed to high voltage transients, the varistor Z1 impedance changes several orders of magnitude from a near open circuit to a highly conductive level, thus clamping the transient voltage to a safe level. Therefore, any potentially destructive energy of a transient pulse is prevented by varistor Z1 from damaging the output switching circuits 23 and 24.

Resistor R21 is provided in the circuit illustrated in FIG. 1 to balance the impedance loading of the pulse receiver circuit. In other words, R21 is connected on one side to the coil of the circuit in FIG. 1, and R1 is connected to the other coil on the other side thus balancing the resistive impedance of both sides of the coil. In telephone applications the resistive component of each coil is approximately 190 to 200 ohms. It is therefore important that the resistance added by the pulse receiver not cause an imbalance of longitudinal impedance and also not add excessive resistive component to the circuitry. In the preferred embodiment, resistors R1 and R21 are each a value of 4.7 ohms. This magnitude of resistance is small in comparison with the resistive component of each of the coils and therefore does not add an excessive amount of resistance to the overall circuit.

Any problem that arises from using such a small resistance for R1 is compensated by the circuit design of the switching circuitry 21 and 22, in addition to the protective components of the input circuitry 20. While the input circuitry proivdes high voltage protection, signal gain control and an alternating current filter as previously discussed, the switching circuitry stages 21 and 22 provide a sensitive but yet reliable means to detect the relatively small voltage signal across R1 in a manner that minimizes any distortion while providing positive feedback which produces a stabilized state transition condition minimizing any "jagged" switching. This positive feedback results in the pulse receiver circuit having a hysteresis characteristic that is similar to a relay hysteresis. Furthermore, since in the preferred embodiment, the switching circuitry comparators U1A and U1B are contained in the same package (i.e., LM393) this configuration also provides temperature compensation.

Therefore the pulse receiver disclosed provides an inexpensive yet reliable replacement for the relays in a telephone circuit.

Although the preferred embodiment of this invention has been described in detail, it should be understood that various changes, substitutions and alterations can be made therein without departing from the spirit and scope of the invention as defined by the appended claims.

What is claimed is:

1. A pulse receiver for connection in a circuit including a first inductance and second inductance connected between a voltage potential and a ground including an external impedance intermittently connected between said first and second inductance, said pulse receiver comprising:
   a first impedance connected in series with the first inductance;
   a second impedance equivalent to the first impedance connected in series with the second inductance;
   input means connected to the first impedance for detecting the connection of an external impedance, said input means including high voltage protection means for protecting said first impedance from excessive voltage, said voltage protection means including first and second diodes connected in parallel and in opposing polarity and together in parallel with the first impedance, and said input means including a signal gain control circuit connected across said first impedance; and,
   switching circuit means including first and second output nodes, said switching means being connected to said input means for changing the state of the first output node from a first state to a second state and changing the state of the second output node from a first state to a second state upon the detection of the external impedance connection, said switching circuit means including voltage bias means for maintaining the first and second output nodes in their respective first states when the external impedance is less than a predetermined value and for maintaining the first and second output nodes in their respective second states when the external impedance is greater than a predetermined value.

2. A pulse receiver according to claim 1, wherein said input means further includes a filter circuit connected across said first impedance for filtering alternating current signals.

3. A pulse receiver according to claim 1, wherein said switching circuit means includes circuit means to minimize distortion of pulse signals received from the input means.

4. A pulse receiver according to claim 1, wherein said switching circuit means includes high voltage transient protection circuitry to protect the switching circuit means elements from high votlage transients.

5. A pulse receiver according to claim 1, wherein said switching circuit means includes means to compensate for different operating temperature ranges.

6. A pulse receiver according to claim 1, wherein said first and second impedances are of resistive values that are not greater than ten percent of the resistive values of the first and second inductances.

7. A pulse receiver for connection in a circuit including a first inductance and second inductance connected between an operating voltage potential and a ground reference potential including an external impedance intermittently connectable in series circuit relation with the first and second inductances, said pulse receiver comprising:
   a sensing resistor connected in series circuit relation with the first inductance;
   input means connected to the sensing resistor for detecting a connection of the external impedance in series circuit relation with the first and second inductances,
   switching circuit means connected to said input means for changing the state of a first output node from a first state to a second state and changing the state of a second output node from a first state to a second state upon the detection of the external impedance series connection; and,
   said switching circuit means including voltage bias means for maintaining the first and second output nodes in their respective first states when the external impedance is less than a predetermined value and for maintaining the first and second output nodes in their respective second states when the external impedance is greater than a predetermined value.

* * * * *